United States Patent [19]
Choi et al.

[11] Patent Number: 5,256,586
[45] Date of Patent: Oct. 26, 1993

[54] GATE-TO-DRAIN OVERLAPPED MOS TRANSISTOR FABRICATION PROCESS

[75] Inventors: Young-Seok Choi, Pucheon; Kwang-Dong Yu, Incheon; Tae-Young Won, Seoul, all of Rep. of Korea

[73] Assignee: SamSung Electronics., Ltd., Suwon, Rep. of Korea

[21] Appl. No.: 726,189

[22] Filed: Jul. 5, 1991

[30] Foreign Application Priority Data

May 23, 1991 [KR] Rep. of Korea ............... 1991-8363

[51] Int. Cl.$^5$ .................................... H01L 21/336
[52] U.S. Cl. .................................. 437/44; 437/41; 437/233; 257/336
[58] Field of Search ................... 437/28, 29, 30, 41, 437/44, 233, 238, 909; 357/23.3; 257/336

[56] References Cited

U.S. PATENT DOCUMENTS

| | | | |
|---|---|---|---|
| 5,013,675 | 5/1991 | Shen et al. | 437/44 |
| 5,024,959 | 6/1991 | Pfiester | 437/44 |
| 5,120,673 | 6/1992 | Itoh | 437/44 |

FOREIGN PATENT DOCUMENTS 3120835  5/1991  Japan .................. 437/44

Primary Examiner—Mary Wilczewski
Attorney, Agent, or Firm—Robert E. Bushnell

[57] ABSTRACT

A method for fabricating a gate-to-drain overlapped MOS transistor in which gate-to-drain capacitance is lower and a structure thereby. A pad oxide layer is formed over a substrate having a first conductive layer with a first pattern formed on a first gate oxide layer, and etchback process is performed until surface part and a predetermined upper parts of the both side walls of the first conductive layer is exposed. As a result, a second conductive layers with a second pattern is formed and a second gate oxide layer thicker than the first gate oxide layer is formed.

15 Claims, 3 Drawing Sheets

GATE-TO-DRAIN OVERLAPPED MOS TRANSISTOR FABRICATION PROCESS

BACKGROUND OF THE INVENTION

The present invention relates to a semiconductor device, and particularly to a process for fabricating a gate-to-drain overlapped metal-oxide-semiconductor (MOS) transistor and a structure thereby.

Lightly doped drain (LDD) structures with complete overlap between a low concentration diffusion region and a gate thereof such as an Inverse-T Lightly Doped Drain structure (ITLDD) and a gate overlapped drain (GOLD) structure have been proposed as ways to improve hot carrier reliability and performance of submicron MOS.

The ITLDD and GOLD structures are disclosed in International Electron Device Meeting (IEDM) Tech. Dig., 1989, pp 769–772, IEDM Tech. Dig., 1986, pp 742–745, IEDM Tech. Dig., 1987, pp 38–41, and IEDM Tech. Dig., 1989, pp 617–620.

FIG. 1 is a cross-sectional view of a conventional MOS transistor of ITLDD structure. Diffusion regions 6 of second conductive type are isolated from each other by the channel region which is formed within a first conductive type semiconductor substrate 1, and an insulation layer 7 is formed on the surface of the substrate 1. An inverse T-shaped gate 9 is disposed over the channel region and the diffusion region adjacent to the channel region, and insulation layer spacer regions 11 are formed on the external side walls of the gate 9. In this case, the diffusion regions 6 include low concentration regions 3 and high concentration regions 5, and the gate 9 and the low concentration regions 3 overlap.

By such structure as stated above, the effect of improving a current characteristic and reducing electric field between the insulation layer and the silicon substrate can be obtained. However, the problem is that gate-to-drain overlap capacitance $C_{gdo}$ increases by gate-to-drain overlap so as to delay transmission time.

SUMMARY OF THE INVENTION

It is therefore an object of the present invention to provide a structure of MOS transistor wherein gate-to-drain capacitance is minimized and fabrication process therefor.

According to an aspect of the present invention, an inventive MOS transistor has thicker insulation layer formed in the region where a gate and a drain are overlapped, by forming an oxide insulation layer over a substrate after forming a conductive layer with a first pattern on the substrate.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
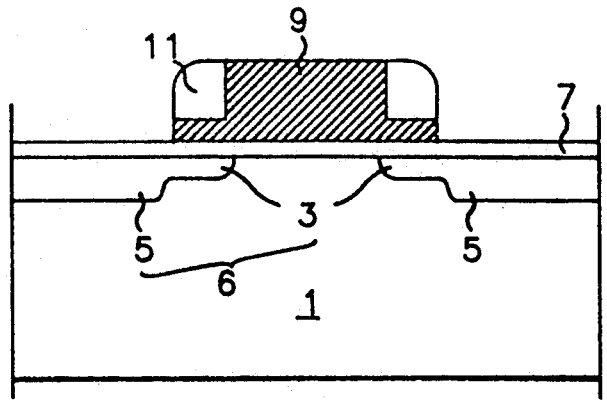
FIG. 1 is a cross-sectional view of a conventional MOS transistor structure.
Figure 2:
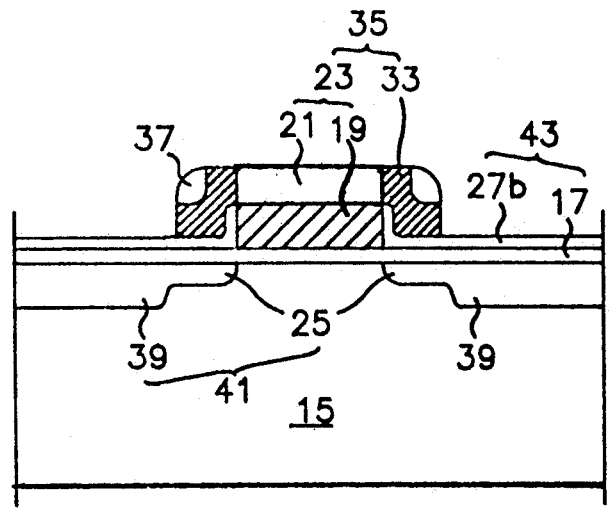
FIG. 2 is a cross-sectional view of a MOS transistor structure according to the present invention.

Referring to FIG. 2, Diffusion regions 41 of second conductive type are isolated from each other by the channel region formed within a first conductive type semiconductor substrate 15, including low concentration regions 25 and high concentration regions 39, and a first insulation layer 17 with a first thickness is formed on the surface of a substrate. A first conductive layer 23 with a first pattern is formed on the first gate insulation layer 17, including a lower conductive layer 19 made of poly-crystalline silicon and an upper conductive layer 21 made of fire-resisting metal like silicide. Second conductive layers 33 with a second pattern are isolated from lower parts of the external side wells of the first conductive layer 23 by means of gate insulation layers 27b with a second thickness, and isolated from the substrate 15 to the extent of third thickness which is equal to sum of the first thickness of the first gate insulation layer 17 and the second thickness of the gate insulation layers 27b, being attached to the upper parts of the external side wells of the first conductive layer 23. The above first conductive layer 23 and second conductive layers 33 correspond to a gate 35. Here, an insulation layer spacer regions 37 are formed on both external side walls of the gate 35.

As shown of FIG. 2, second gate insulation layers 43 which include the first gate insulation layer 17 and the gate insulation layers 27b, the region where the gate and a drain are overlapped, are thicker than the gate insulation layer formed on the channel region. Such structure is called a gate-overlapped-on-twin-oxide (GOTO) LDD structure.

Figure 3A:
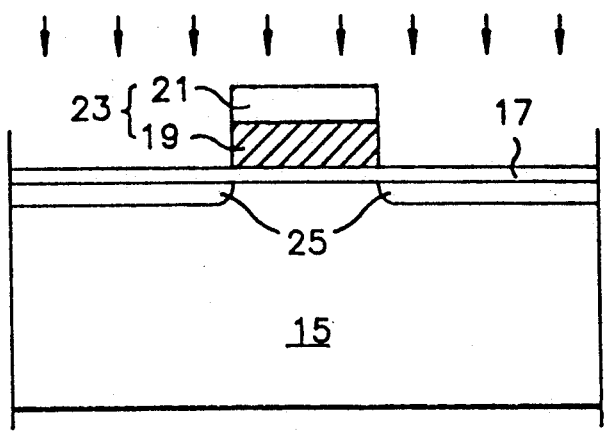
FIGS. 3A to 3F illustrate fabrication processes of the MOS transistor according to the present invention.

In FIG. 3A, a fist gate oxide layer 17 of about 150 Å–200 Å thickness is formed on the surface of p-type semiconductor substrate 15, and then the conductive layer 23 with the first pattern is formed on the first gate oxide layer 17. In this case, the conductive layer 23 is formed by stacking a tungsten silicide layer 21 of about 1500 Å thickness on a first poly-crystalline silicon layer 19 of about 2500 Å thickness, in order to improve an electric characteristic. Then, the low concentration source and drain regions 25 are formed by implanting n-type impurities from the upper part of the substrate 15. In this case, the conductive layer 23 with first pattern serves as a mask.

Figure 3B:
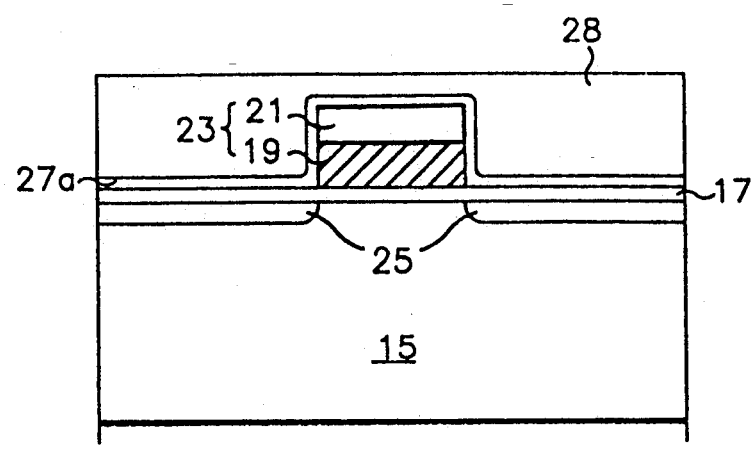

In FIG. 3B, a thin pad oxide layer 27a of about 150 Å–200 Å thickness is formed by thermal oxidization on the surfaces of the conductive layer 23 and the first gate oxide layer 17, and then the first gate oxide layer 17 is covered with photoresist 28.

Figure 3C:
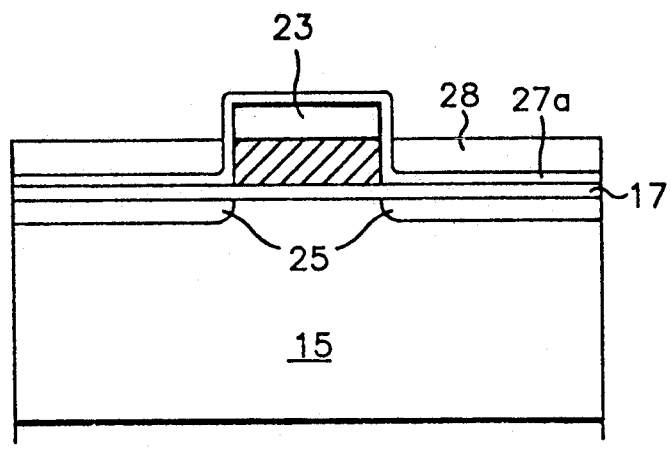

In FIG. 3C, the photoresist 28 is etched to a predetermined thickness by an etchback process, until the pad oxide layer 27a formed on the surface and on the upper part of the side walls of the first conductive layer 23 is exposed.

Figure 3D:
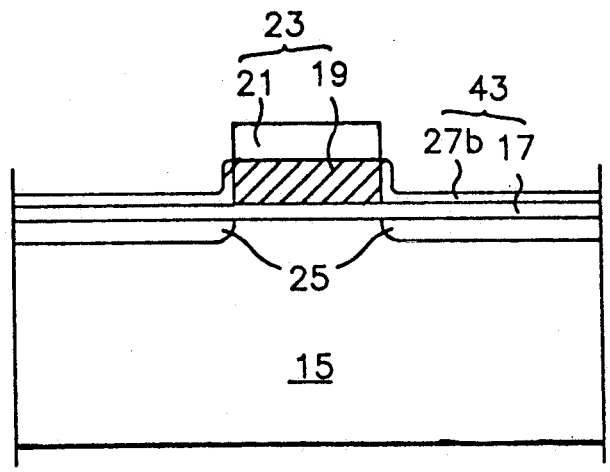

In FIG. 3D, the exposed pad oxide layer 27a is removed by wet or dry etching and then the photoresist 28 remaining over the substrate 15 is removed. By the above process, the second gate oxide layers 43 of 220 Å–300 Å thickness are formed on the surface of the low concentration source and drain regions 25 by forming pad oxide layers 27b on the first gate oxide layer 17.

The photoresist 28 and pad oxide layer 27a are etched in consecutive order, in FIGS. 3C and 3D, but the photoresist 28 and pad oxide layer 27a can be simultaneously etched in other embodiment of the present invention. That is, an etchback process is carried out under condition that the etching rate of the pad oxide layer is higher than that of photoresist by using carbon tetrafluoride CF$_4$ or oxygen O$_2$, to thereby simultaneously remove the pad oxide layer formed on the surface and on the side walls of the tungsten silicide layer 21.

Furthermore, only the pad oxide layer formed on the side walls of the first poly-crystalline silicon layer 19 is let to remain in one embodiment of the present invention, but the height of the pad oxide layer remaining on the side walls of the conductive layer with first pattern can be changed in other embodiment of the present invention.

Figure 3E:
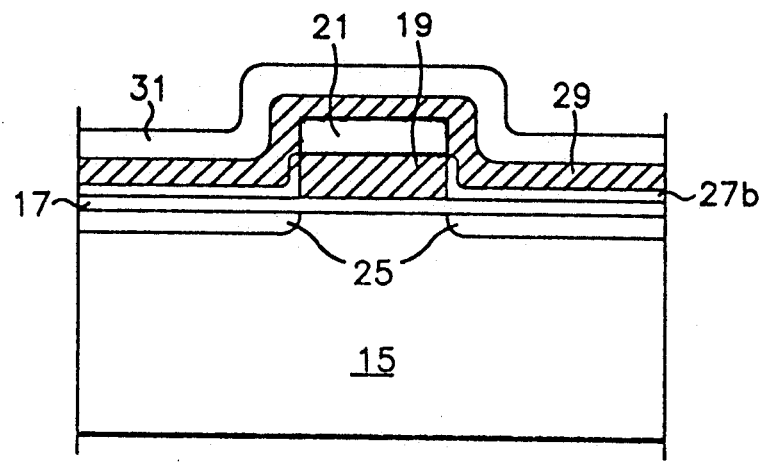

In FIG. 3E, a second poly-crystalline silicon layer 29 of 500 Å–2000 Å thickness and a low temperature oxide layer 31 of 1000 Å–2000 Å thickness are formed on the first conductive layer 23 and on the second gate oxide layers 43.

Figure 3F:
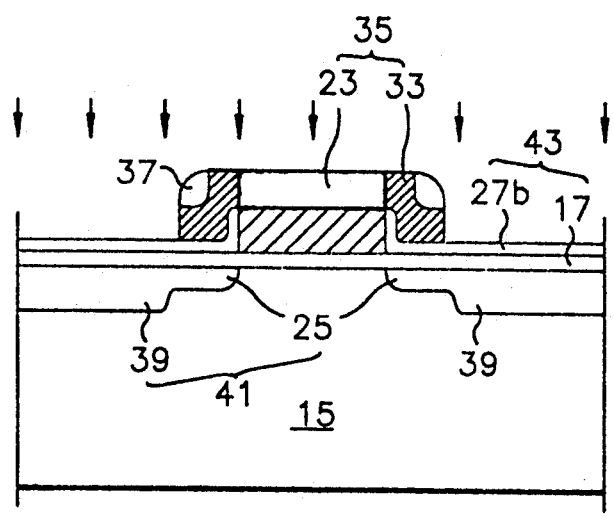

Next, in FIG. 3F, a reactive ion etching (RIE) process is performed until the surface of the tungsten silicide layer 21 is exposed. Then the low temperature oxide spacer regions 37 are formed on both external side walls, at which the side walls extend upwardly, of the second poly-crystalline silicon layer 29. In this case, the low temperature oxide layer 31 and the second poly-crystalline silicon layer 29 other than lower and inner portions of the low temperature oxide spacer regions 37 are removed, thereby to form the second conductive layers 33. Thereafter, the high concentration source and drain regions 39 are formed, by implanting the n-type impurities into the substrate 15, by using the gate 35 formed the first and second pattern conductive layers 23, 33 as the mask.

The capacitance C of the region where the gate and the drain are overlapped can be expressed by $C = \epsilon A/d$, here, the symbol $\epsilon$ represents a dielectric constant, the symbol A represents an area where the gate and the drain are overlapped, and the symbol d represents thickness of insulation layer in the region where a gate and a drain are overlapped. As described the above formula, the capacitance C is proportional to area A and inversely proportional to thickness d. If thickness of the insulation layers in the regions where the gate and the drain are overlapped is respectively expressed by d1 in the conventional invention and by d2 in the present invention, the thickness d2 is much greater than the thickness d1, in the same area A. Therefore, the transistor according to the present invention has greatly reduced capacitance.

As mentioned hereinabove, the present invention having the structure of gate-to-drain overlapped MOS transistor forms the second gate oxide layer thicker than the first gate, on the surface of source and drain region, by performing the process which forms the first gate oxide layer on the surface of the substrate and forms the conductive layer in first pattern on the pad oxide layer, and the process which performs etchback until the surface and the upper portion of the side walls of the conductive layer with the first pattern is exposed and covers the second poly-crystalline silicon layer thereover.

Consequently, the present invention has an effect of reducing gate-to-drain capacitance by the overlapping of a gate and a drain. The present invention also has another effect of increasing the operation characteristic of element by minimizing the transmission delay time of MOS transistor. Particularly, the present invention has the advantage of making a process easy by forming a second gate oxide layer without supplementing a mask.

While the invention has been particularly shown and described with reference to a preferred embodiment, it will be understood by those skilled in the art that modifications in detail may be made without departing from the spirit and scope of the invention.

What is claimed is:

1. A method for fabricating a gate-to-drain overlapped MOS transistor having a semiconductor substrate of a first conductivity type, diffusion regions of a second conductivity type isolated from each other by a channel region formed within the substrate, and a first conductive layer formed on a first gate insulation layer formed on the surface of said channel region, said first gate insulating layer extending over said diffusion regions, said method comprising steps of:

(a) forming a first insulation layer over exposed surfaces of said first conductive layer and said first gate insulation layer, and forming a photoresist on said first insulation layer;

(b) carrying out a first etching process to etchback said photoresist to expose a part of said first insulation layer, said part being that part of the first insulation layer that was formed on a top surface of said first conductive layer and on an upper portion of both sidewalls of said first conductive layer, and to etch said exposed part of said first insulation layer to expose an upper portion of said first conductive layer and to remove the remaining photoresist to expose the remaining portions of said first insulation layer;

(c) forming a second conductive layer over said exposed remaining portions of said first insulation layer and over said exposed upper portion of said first conductive layer, and forming a second insulation layer over said second conductive layer; and (d) performing a second etching process by removing part of said second insulation layer and part of said second conductive layer until the top surface of said first conductive layer is exposed, and removing part of the remaining portions of said second insulation layer and part of remaining portions of said second conductive layer formed over said diffusion regions to form gate sidewall spacers having a conductive layer therein.

2. A method according to claim 1, wherein said forming step (a) forms a second gate insulation layer comprised of said first gate insulation layer and said first insulation layer.

3. A method according to claim 2, further comprising forming said second gate insulation layer to be 220 Å–300 Å thick.

4. A method according to claim 1, further comprising forming said first insulation layer as an oxide layer.

5. A method according to claim 1, wherein said first etching process to etchback said photoresist, to etch said exposed part of said first insulation layer and to remove said remaining photoresist is performed sequentially.

6. A method according to claim 1, wherein an etching rate of said first insulation layer is higher than that of said photoresist in order for said first etching process to etchback said photoresist, to etch said exposed part of said first insulation layer and to remove said remaining photoresist simultaneously.

7. A method according to claim 1, wherein said second conductive layer is a poly-crystalline silicon layer.

8. A method according to claim 1, wherein said second insulation layer is an oxide layer.

9. A method according to claim 1, wherein said first conductive layer is a single poly-crystalline silicon layer, or a layer formed by stacking a silicide layer of fire-resisting metal on a poly-crystalline silicon layer.

10. A method according to claim 1, further comprising a step of:
forming high concentration source and drain regions by implanting n-type impurities into said substrate and said diffusion regions not masked by said gate sidewall spacers.

11. A method for fabricating a gate-to-drain overlapped MOS transistor, comprising:
forming diffusion regions of second conductivity type isolated from each other by a channel region formed within a semiconductor substrate of a first conductivity type;
forming a first insulation layer over said diffusion regions and said channel regions;
forming a first conductive layer having a first pattern on said first insulation layer and over said channel region;
forming a second insulation layer over exposed surfaces of said first conductive layer and said first insulation layer, and forming a photoresist on said second insulation layer;
etching said photoresist and said second insulation layer until there is only a portion of said second insulation layer remaining, said remaining portion of said second insulation layer comprising a part remaining on a lower section of both side walls of said first conductive layer and on said first insulation layer;
forming a second conductive layer over said remaining portion of said second insulation layer and over exposed upper sections of both side walls and an exposed top surface of said first conductive layer and forming a third insulation layer over said second conductive layer; and
etching portions of said third insulation layer and said second conductive layer to expose the top surface of said first conductive layer and a portion of a top surface of said second insulation layer, the remaining portions of said third insulation layer and said second conductive layer forming sidewall spacer regions for masking part of said diffusion regions, said remaining portion of said second conductive layer having a second pattern different than said first pattern of said first conductive layer.

12. The method according to claim 11, further comprising said first conductive layer being selected from a group comprising a single poly-crystalline silicon layer and a layer formed by stacking a silicide layer of fire-resisting metal on a poly-crystalline silicon layer.

13. The method according to claim 11, further comprising said second conductive layer comprising a poly-crystalline silicon layer.

14. The method according to claim 11, further comprising said first and second insulation layers comprising oxide layers.

15. A method according to claim 11, further comprising a step of:
forming high concentration source and drain regions by implanting n-type impurities into said substrate and said diffusion regions not masked by said sidewall spacer regions.

* * * * *